United States Patent [19]
McLaury

[11] Patent Number: 5,896,339
[45] Date of Patent: Apr. 20, 1999

[54] MULTI-BIT BLOCK WRITE IN A RANDOM ACCESS MEMORY

[75] Inventor: Loren L. McLaury, Boise, Id.

[73] Assignee: Micron Technology, Inc., Boise, Id.

[21] Appl. No.: 09/146,250

[22] Filed: Aug. 3, 1998

Related U.S. Application Data

[63] Continuation of application No. 08/717,712, Sep. 23, 1996, abandoned.

[51] Int. Cl.$^6$ ............................................. G11C 8/00
[52] U.S. Cl. ..................... 365/230.02; 365/230.03; 365/230.05
[58] Field of Search ................... 365/230.02, 230.03, 365/230.05

[56] References Cited

U.S. PATENT DOCUMENTS

| | | | |
|---|---|---|---|
| 4,807,189 | 2/1989 | Pinkham et al. | 365/189 |
| 4,879,692 | 11/1989 | Tokushige | 365/230.03 |
| 4,891,794 | 1/1990 | Hush et al. | 365/189.04 |
| 5,235,545 | 8/1993 | McLaury | 365/189.04 |
| 5,282,177 | 1/1994 | McLaury | 365/230.05 |
| 5,311,478 | 5/1994 | Zagar et al. | 365/230.06 |
| 5,323,350 | 6/1994 | McLaury | 365/208 |
| 5,394,172 | 2/1995 | McLaury | 365/230.05 |

*Primary Examiner*—David Nelms
*Assistant Examiner*—Trong Phan
*Attorney, Agent, or Firm*—Schwegman, Lundberg, Woessner & Kluth, P.A.

[57] ABSTRACT

An integrated circuit memory is described which has a multi-bit write register. Each plane of the multi-bit write register has a plurality of bits, or columns. The multi-bit write register allows each memory cell in a block of selected memory cells of the integrated circuit memory to be block written to a different logic state. The write register can be a color register in a multi-port memory device, or a single port device. Several methods of loading the write register are also described. These methods include loading the write register one column at a time or one plane at a time. The columns or planes can be loaded in either a pre-determined pattern, or selectively loaded.

24 Claims, 8 Drawing Sheets

MULTI-BIT BLOCK WRITE IN A RANDOM ACCESS MEMORY

This application is a continuation of U.S. Ser. No. 08/717,712 filed Sep. 23, 1996, now abandoned.

TECHNICAL FIELD OF THE INVENTION

The present invention relates generally to integrated memories and in particular to block write functions in integrated memories. Still more particular, the present invention describes a multi-bit write apparatus and its operation.

BACKGROUND OF THE INVENTION

Multi-port random access memories (RAM) are substantially faster than standard RAM and commonly referred to as video random access memories (VRAM) because of their effectiveness in video systems. FIG. 1 illustrates a block diagram of a prior art multi-port memory similar to the memory described in U.S. Pat. No. 4,891,794 issued to Hush et al. entitled "Three Port Random Access Memory" assigned to the assignee of the present invention and incorporated by reference. In its simplest form, the multi-port memory includes a dynamic random access memory (DRAM) 90, a DRAM controller 92, two serial access memories (SAM) 94, 96 and a SAM controller 98. Each SAM is essentially a long shift register which can receive a block of data from the DRAM and serially shift the data out through a data port 99. The SAM can also serially shift data in through the serial port and transfer the data to the DRAM.

The DRAM is a dynamic array for storing multi-bit registers in multiple two dimensional planes each having memory cells arranged in rows and columns. The DRAM has address line inputs 95 and a plurality of input/output lines 97. Each of the registers are defined by the same row and column addresses in the multiple planes. Each SAM has a multi-bit register row associated with each of the planes of the DRAM were the columns of the DRAM correspond to the bits of the register row. In general, the DRAM and SAM's can operate either independently or in limited combinations for internal transfers of data. When operating in combination, the SAM's are structured to allow each SAM to access one row of the DRAM.

Various features have been incorporated in VRAM's to speed the transfer of data to and from an associated graphics processor or microprocessor. One example of a function used to speed memory writing is the 'block write' function. U.S. Pat. No. 5,282,177 entitled "Multiple Register Block Write Method and Circuit for Video DRAMs" issued to McLaury on Jan. 25, 1994 describes several methods and circuits for block writing to a DRAM and is incorporated herein by reference.

The block write is useful in a VRAM to quickly clear a large area of frame buffer or to create a background for a display. The block write function simultaneously writes to a block of memory cells instead of writing to each cell individually. The block of cells can be pre-selected number of cells in a row of the DRAM or the entire row of memory cells. The block of selected cells in each plane of memory is written to the same state. That is, one bit of a multi-bit write register is written to each cell of the selected block.

U.S. Pat. No. 5,282,177 discloses a multiple register block write. The multiple register block write is similar to the block write described above except the write register has multiple registers. The multiple write register has a plurality of eight bit static memory registers. Any one of the plurality of write registers can transfer data to the VRAM. The multiple write register, therefore, eliminates the need to re-load a single write register for different block writes by pre-loading all of the multiple write registers.

The prior art allows for a block of memory to be written to by one bit of a write register. Each memory cell of the block is written to the same logic state, 1 or 0. Prior art fails to provide a means for transferring different logic states to the different cells of each row of the block via the random access port.

Block write functions allow for fast, efficient transfers of data to a memory, such that blocks of memory can be simultaneously written to a common state. If a portion of the block needs to be a different state, that portion must be either blocked from writing or edited by a later write function. Block writing to a block of memory followed by several edit operations is time consuming. What is needed is the ability to write a block of memory so that subsequent editing is reduced or eliminated.

For the reasons stated above, and for other reasons stated below which will become apparent to those skilled in the art upon reading and understanding the present specification, there is a need in the art for a circuit and method for block writing data to a DRAM such that the individual cells of a selected block can be written to different states, in a simultaneous fashion.

SUMMARY OF THE INVENTION

The above-mentioned problems with block write functions and other problems are addressed by the present invention and which will be understood by reading and studying the following specification.

The present invention describes an integrated circuit memory which has a plurality of memory cells. The memory comprises at least one addressable block of memory cells, and a write register. The write register has a plurality of register cells with each register cell corresponding to one of the memory cells of the addressable block. In one embodiment, the write register comprises a color register.

Another embodiment describes an integrated circuit memory having a plurality of memory cells arranged in a plurality of memory planes. The memory comprises a plurality of addressable blocks of memory cells with each of the plurality of addressable blocks of memory cells being located in a different one of the plurality of memory planes, and a write register having a plurality of register cells arranged in a plurality of multi-cell planes. Each one of the plurality of multi-cell planes corresponds to a different one of the plurality of register cells and each one of the plurality of register cells is connected to one of the plurality of memory cells.

In still another embodiment describes a multi-port memory device having a random access memory array comprising a plurality of random access memory cells arranged in a plurality of memory planes. The multi-port memory comprises a plurality of addressable blocks of the plurality of random access memory cells with each of the plurality of addressable blocks being located in a different one of the plurality of memory planes. A write register is provided having a plurality of register cells arranged in a plurality of multi-cell planes with each one of the plurality of multi-cell planes corresponding to a different one of the plurality of memory planes with each one of the plurality of register cells being associated with one of the plurality of random access memory cells. Finally, the memory has at least one mask circuit electrically located between the write register and the random access memory.

A method is provided for loading a write register in an integrated circuit random access memory where the write register has a plurality of planes with each one of the plurality of planes having a plurality of register cells. The method comprises the steps of loading a first one of the plurality of register cells in each of the plurality of planes on a column access cycle, and individually loading in a predetermined pattern additional ones of the plurality of register cells in each of the plurality of planes on successive column access cycles.

An alternative method is provided for loading a write register in an integrated circuit random access memory where the write register has a plurality of planes with each one of the plurality of planes having a plurality of register cells. The method comprises the steps of selectively addressing a first one of the plurality of register cells in each of the plurality of planes, loading the first one of the plurality of register cells in each of the plurality of planes on a column access cycle, and selectively addressing and loading additional ones of the plurality of register cells in each of the plurality of planes on successive column access cycles.

Still another method is provided for loading a write register in an integrated circuit random access memory where the write register has a plurality of planes with each one of the plurality of planes having a plurality of register cells. The method comprising the steps of loading a first one of the plurality of planes on a column access cycle, and individually loading additional ones of the plurality of planes on successive column access cycles.

BRIEF OF DESCRIPTION OF THE DRAWINGS

DETAILED DESCRIPTION OF THE INVENTION

In the following detailed description of the preferred embodiment, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

This invention concerns electrical circuitry which uses voltages to represent the two binary logic levels. The words "low" and "high" in this specification refer generally to the false and true binary logic levels, respectively. Signals are generally considered active when they are high, however, an asterisk (*) following the signal name, or a bar above the signal name in this application indicates that the signal is negative or inverse logic. Negative or inverse logic is considered active when the signal is low.

The present invention provides a multi-bit write register which allows for block writing to a random access memory (RAM) such that individual memory cells in a plane of memory can be written to different logic states.

Figure 1:
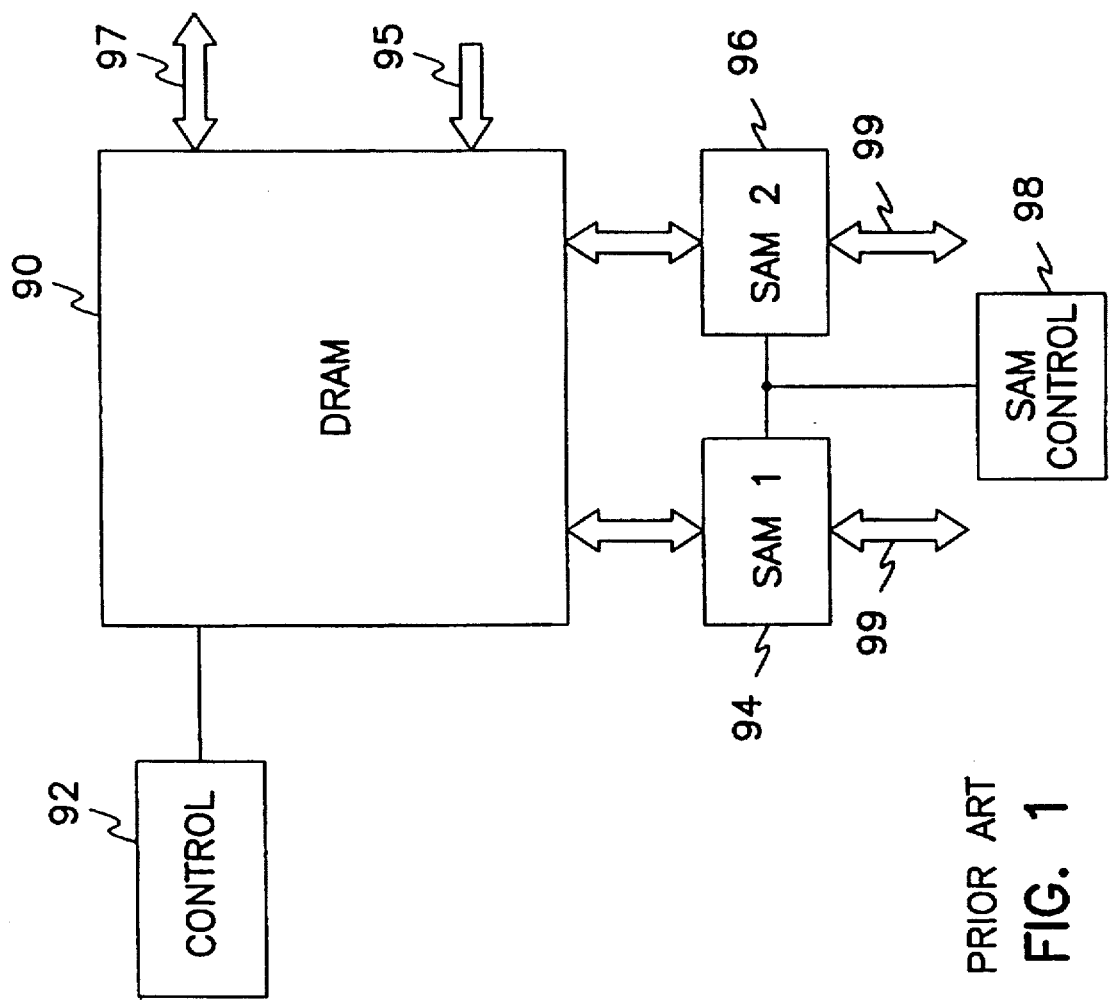
FIG. 1 is a block diagram of a prior art multi-port memory.
Figure 2:
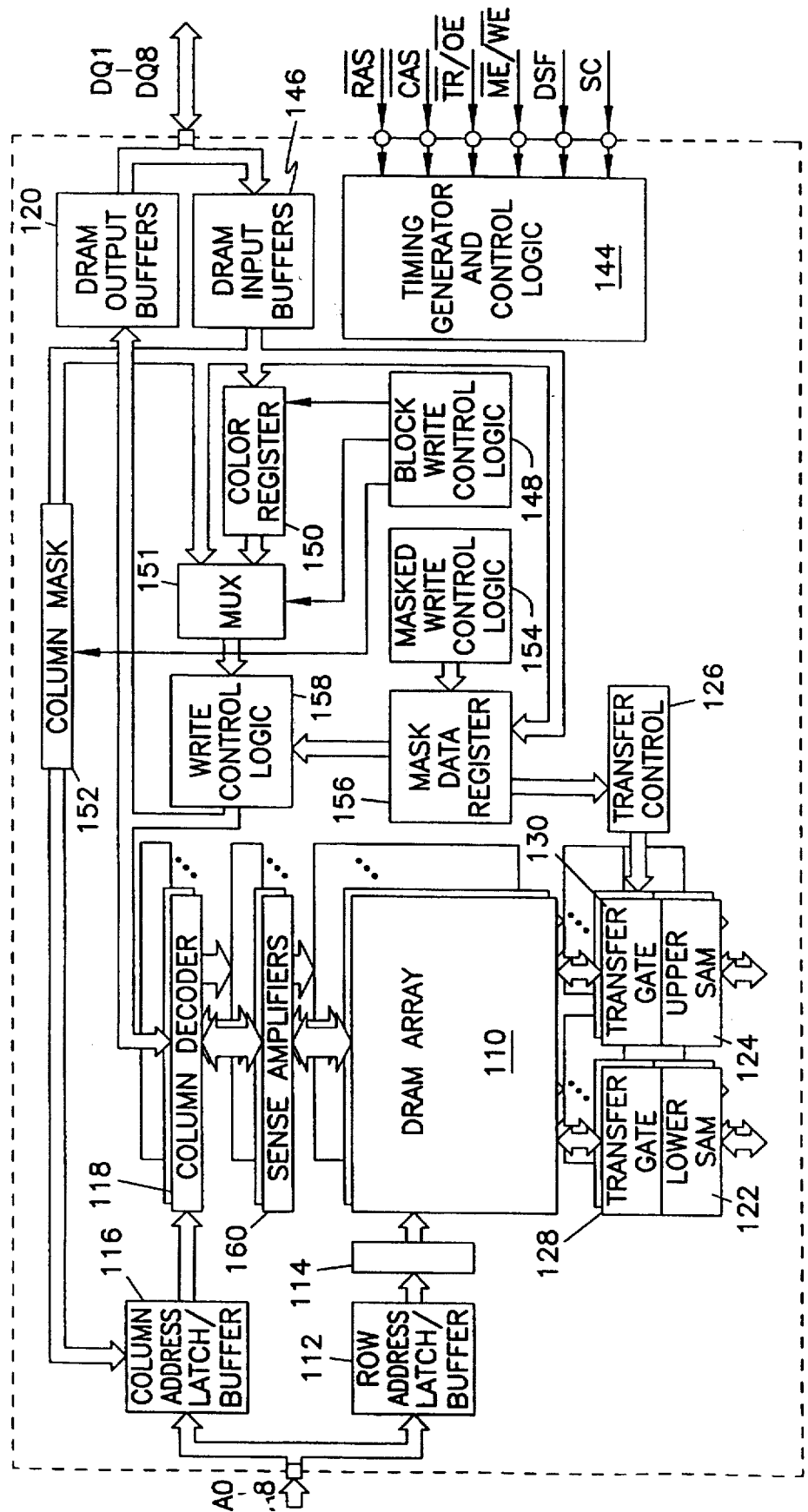
FIG. 2 is a more detailed block diagram of a multi-port memory incorporating the present invention.

FIG. 2 illustrates a more detailed block diagram of a multi-port memory incorporating the present invention. Detailed elements of portions of the memory have been left out of the figure to focus on the features more directly relevant to the present invention. The multi-port memory shown is a VRAM similar to the 256 k by 8 bit VRAM available as part number MT42C8256 produced by Micron Technology Inc., Boise, Id., the assignee of the present invention. A complete description of this memory can be found in Micron Semiconductor, Inc. Data Book, page 2-139 to 2-179(1993).

DRAM 110 is a 512 by 512 by 8 bit array which can be accessed by a microprocessor (not shown) through input/output connections including address lines A0–A8. Row address latch/buffer 112 and row decoder 114 receive and decode a row address from a row address signal provided on A0–A8, and address or activate a corresponding row of the DRAM. Likewise, column address latch/buffer 116 and column decoder 118 receive and decode a column address from a column address signal provided on A0–A8, and address or activate the corresponding column of the DRAM.

Data stored in the DRAM 110 can be transferred to outputs DQ1–DQ8 through DRAM output buffers 120. Two 256×8 bit serial access memories, SAM's 122 and 124, are provided as independent memories and connected to the DRAM for internal transfers of data. DRAM 110 and SAM's 122 and 124 can operate as described above either independently or in limited combination for internal data transfers. Transfer control circuit 126 controls the internal transfer of data between the SAM's and the DRAM using transfer gates 128 and 130.

Timing generator and control logic 144 is used to control the many available functions of the multi-port memory. DRAM data input is provided on lines DQ1–DQ8 through DRAM input buffers 146. MUX 151 multiplexes the DQ input lines and the color register 150 to write control logic 158. Block write control logic 148, color register 150 and column mask 152 are used to control custom features of the multi port memory, as described in detail below. Masked write control logic 154, masked data register 156, and write control logic 158 are used to control masking features. Sense amplifiers 160 are used to detect and amplify data stored in the DRAM.

Some of the input and output connections of the multi-port memory used to communicate with a microprocessor are described as follows. Serial clock input (SC) to the timing generator and control logic 144 provides the clock input for the SAM memories. Transfer enable/output enable input (TR*/OE*) provides for the internal transfer of data between the DRAM and the SAM's and also enables the output buffers 120 of the DRAM. The masked enable/write enable input (ME*/WE*) is used to perform a masked write function. The ME*/WE* can also be used to select a read or write cycle when accessing the DRAM, this includes a read transfer or write transfer with the SAM's. Special function select input (DSF) is used to indicate which the use of a special function (block write, flash write, split transfer, etc.). Row address strobe (RAS*) input is used to clock in the nine row address bits and strobe for ME*/WE*, TR*/OE*, DSF, SE*, CAS*, and DQ inputs. In standard multi-port memories, the RAS* also acts as the master chip enable and must fall for the initiation of any DRAM or transfer operation. Column address strobe (CAS*) input is used to clock in the nine column address bits.

Address input lines A0–A8 are used to identify a row and column address to select at least one 8 bit word or register out of the available words of DRAM 110, as detailed above. DRAM data input/output lines DQ1–DQ8 provide data input and output for the DRAM and also act as inputs for mask data register 156 and color register 150.

Figure 3:
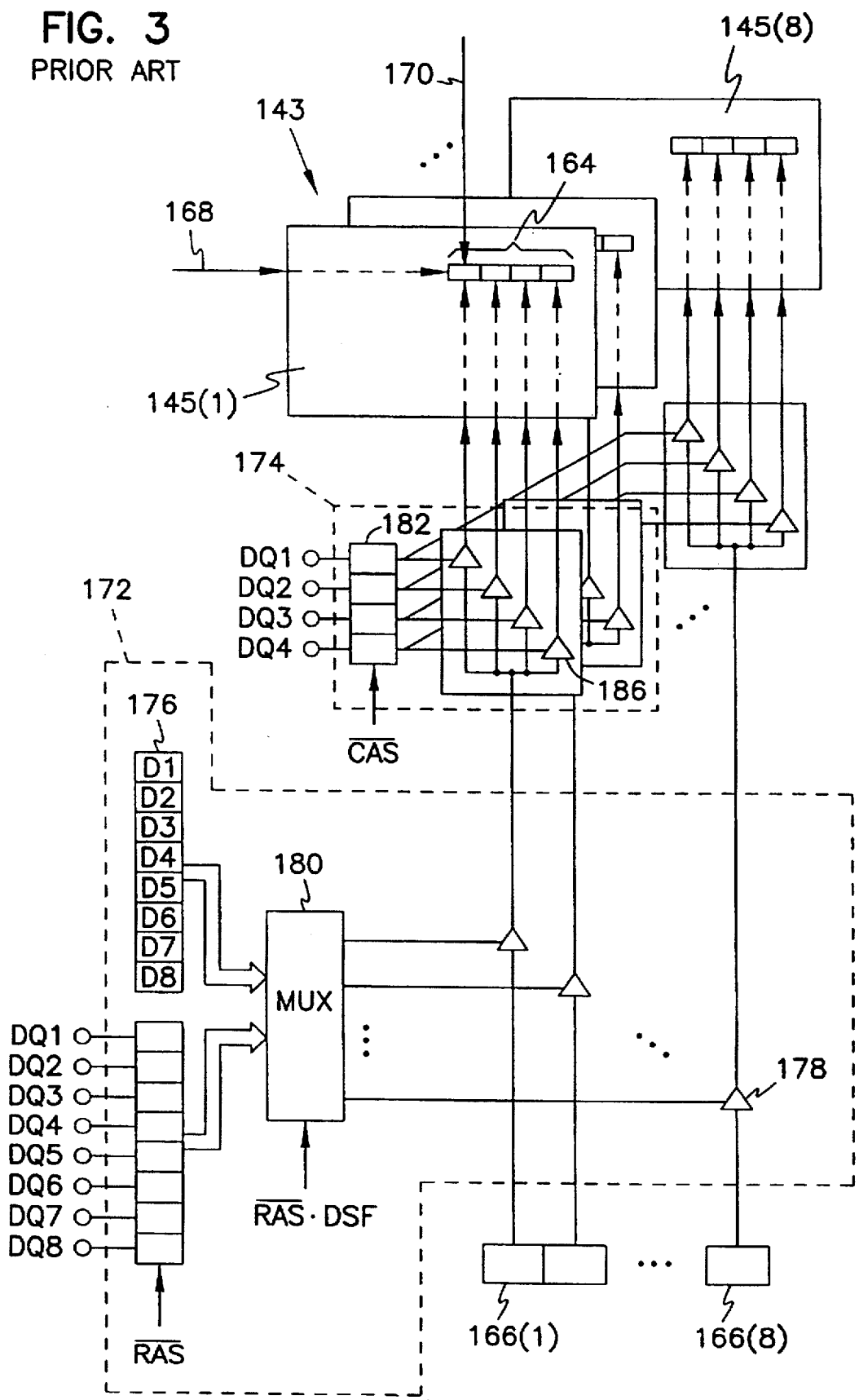
FIG. 3 is a block diagram of a prior art block write.

There are many modes or functions which can be performed using multi-port memories. The two functions of specific importance to the present invention are the block write and load color register functions. The block write function is used to write the contents of the color register 150 directly to adjacent column locations of the DRAM 110, see FIG. 3. The color register 150 must be loaded prior to beginning block write functions, see the load color register function described below. The DRAM row is addressed in the same way as a normal DRAM read or write, however, address lines A2–A8 specify the block of adjacent column locations that will be addressed when CAS* goes low.

The load color register (LCR) function loads data present on the DQ input lines into the color register 150. The contents of the eight bit color register are retained until changed by another load color register function.

The basic block write operation in DRAM memories, as described above, is known to those skilled in the art. There are two basic types of block write functions used in multi-port memories; select block write and flash block write. The 256 k by 8 bit DRAM 143 array shown in FIG. 3 has eight two dimensional planes of memory cells 145(1)–(8) with each plane having 512 rows and 512 columns of memory cells. The individual memory cells are not illustrated except for the selected block 164 of eight addressed memory cells. An eight bit color register 166(1)–(8) is used to store data which will be transferred to the selected DRAM cells, such as selected block 164. Each bit of the color register corresponds to one of the eight planes of the DRAM.

During a block write, a row address 168 and a column address 170 are each provided to the VRAM on input address lines A0–A8. The column address indicates the first memory register address in block 164 of four adjacent memory registers in the addressed row. Data is written simultaneously from the color register 166 to the DRAM 143 through a plane masking circuit 172 and a column masking circuit 174. The plane masking circuit 172 has a mask register 176 and eight enable gates 178. Each of the enable gates corresponds to one of the eight memory planes 145. The eight bits of the mask register 176 can be loaded so that a bit value of one indicates that the enable gate is to be activated so that the corresponding color register bit 166(1)–(8) is to be written to the DRAM. Likewise, a bit value of zero indicates that the corresponding color register bit is to be masked. Multiplexer 180 allows for the DQ inputs to be used to mask the planes instead of the mask register 176.

The column masking circuit 174 has a column mask register 182 and four corresponding enable gates 186. Each of the enable gates corresponds to one of the four addressed memory cells of the block 164. The four bits of each column mask register 182 can be loaded using the DQ inputs so that a bit value of one indicates that the corresponding column is to be written to using color register. Likewise, a bit value of zero indicates that the corresponding column is to be masked.

The flash mask write function is similar to the masked write function except an entire row is written to using the color register. The plane masking circuit can be used with the flash write to select which memory planes will be written. This function allows for a very rapid writing to an entire row of memory. The ability to mask individual columns, however, is not available.

Multi-Bit Block Write

Figure 4:
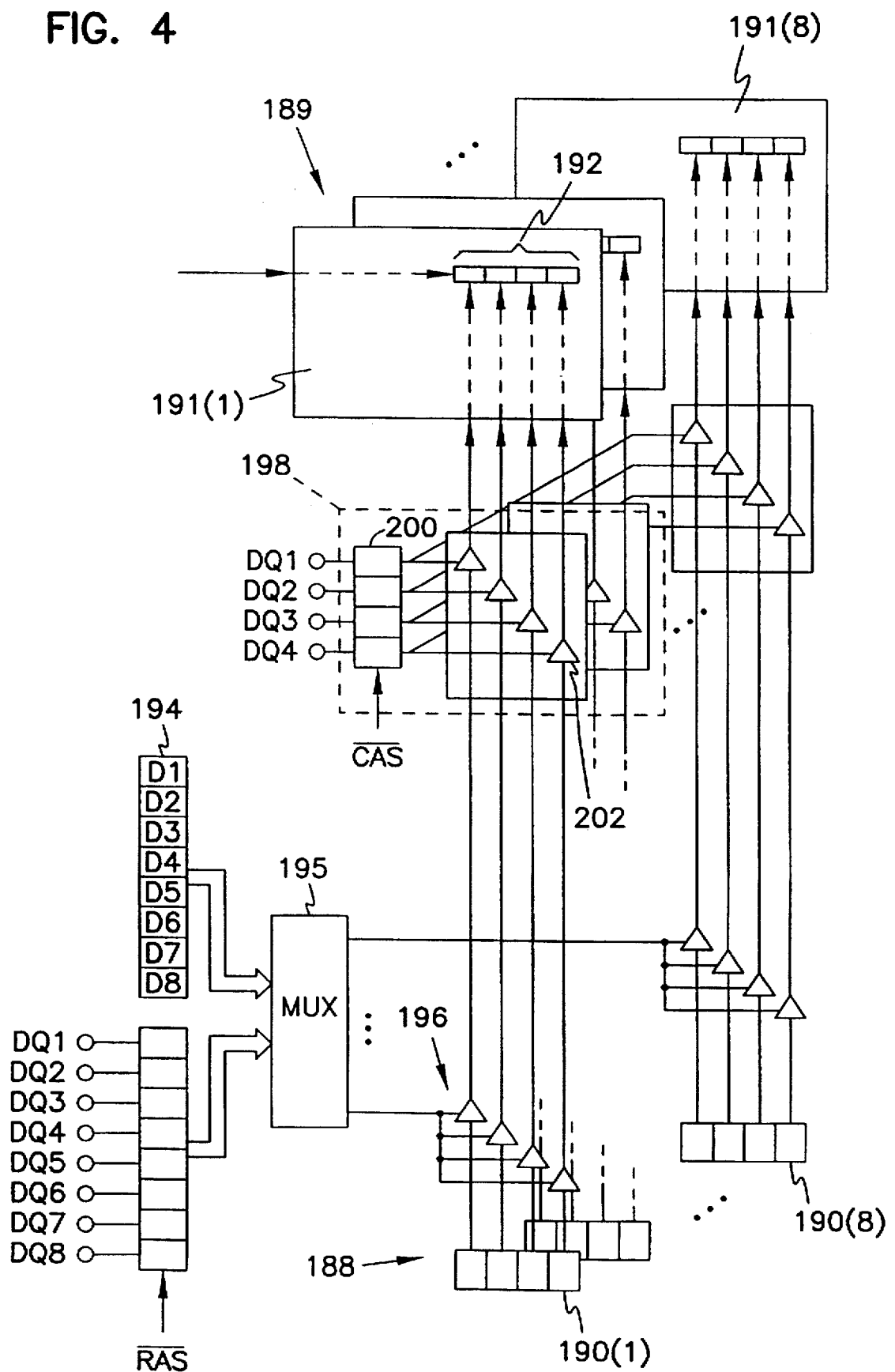
FIG. 4 is a block write incorporating the present invention.

FIG. 4 illustrates one embodiment of a block write function of the present invention in a 256 k by 8 bit DRAM 189 similar to DRAM 143 as described above. Multi-bit write register 188 comprises a 4 by 8 bit register. The write register, therefore, has eight sub-registers 190(1)–(8) which correspond to planes 191(1)–(8) of memory 189. Each sub-register 190 has four bits, or columns. Each bit of the sub-register corresponds to one bit of selected memory block 192 in each plane. That is, the pre-selected number of bits in each memory plane has an associated bit in the write register 188. Either mask register 194 or the DQ inputs can be used through multiplexer 195 to mask a plane of memory by simultaneously disabling all four enable gates 196 connecting a sub-register 190 to one of the eight column mask circuits 198.

The column mask circuits 198 have a four bit column mask register 200 and four corresponding enable gates 202. Each of the enable gates corresponds to one of the four addressed memory cells in block 192. The four bits of each column mask register 200 can be loaded so that a bit value of one indicates that the corresponding column is to be written to using write register 188. Likewise, a bit value of zero indicates that the corresponding column is to be masked.

A large block of data can be written to the DRAM 189 using a multi-bit write register 188. The write register can be a color register used to write a block of data to create blocks of color in a video system. By adding an additional dimension to the color register, as described above, it becomes possible to write each bit in the block to a different state. Each bit, or column, of the sub-registers 190 can be loaded with different logic states to custom write a given block. Subsequent write functions to change individual columns are, thereby, eliminated. Alternatively, the block can be written to the same state by loading the columns of the sub-register to the same logic state.

Due to complexities which already exist in implementing block write functions in integrated circuit memories, the enable gates 196 and 202 are available on present integrated circuit memories. By adding 28 additional registers (3×8 bits) for the write register 188, this embodiment is capable of simultaneously writing a block 32 of four bits per plane to different logic states. This represents a substantial increase in speed in which the bits of a block of memory can be written to different states.

Figure 5:
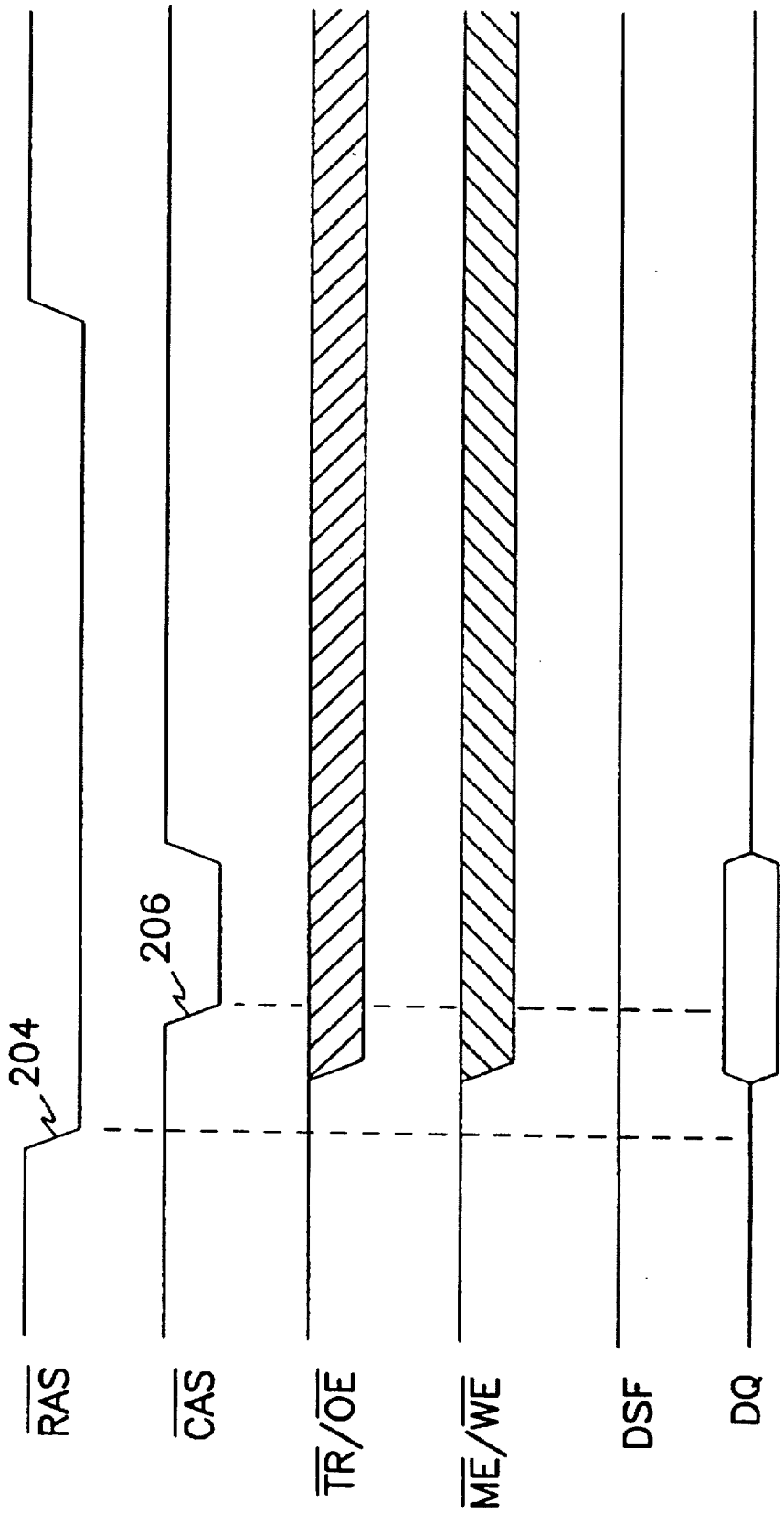
FIG. 5 is a timing diagram of a prior art load color register function.

As noted above, the write register 188 must be loaded prior to performing a block write function. Assuming that the block write function is transferring data from a color register 150 to the DRAM, the color register must be loaded using a load color register function. FIG. 5 shows a typical load color register operation as known to one skilled in the art and described in Micron Specialty DRAM Data Book 1993. The load color register is initiated on a RAS* cycle 204 if TR*/OE*, ME*/WE*, DSF, and CAS* are all high. To load a color register, the CAS* cycle 206 following the RAS* cycle 204 transfers data on the DQ lines to the color register. DSF must be high on the falling edge of CAS* to load the register.

Figure 6:
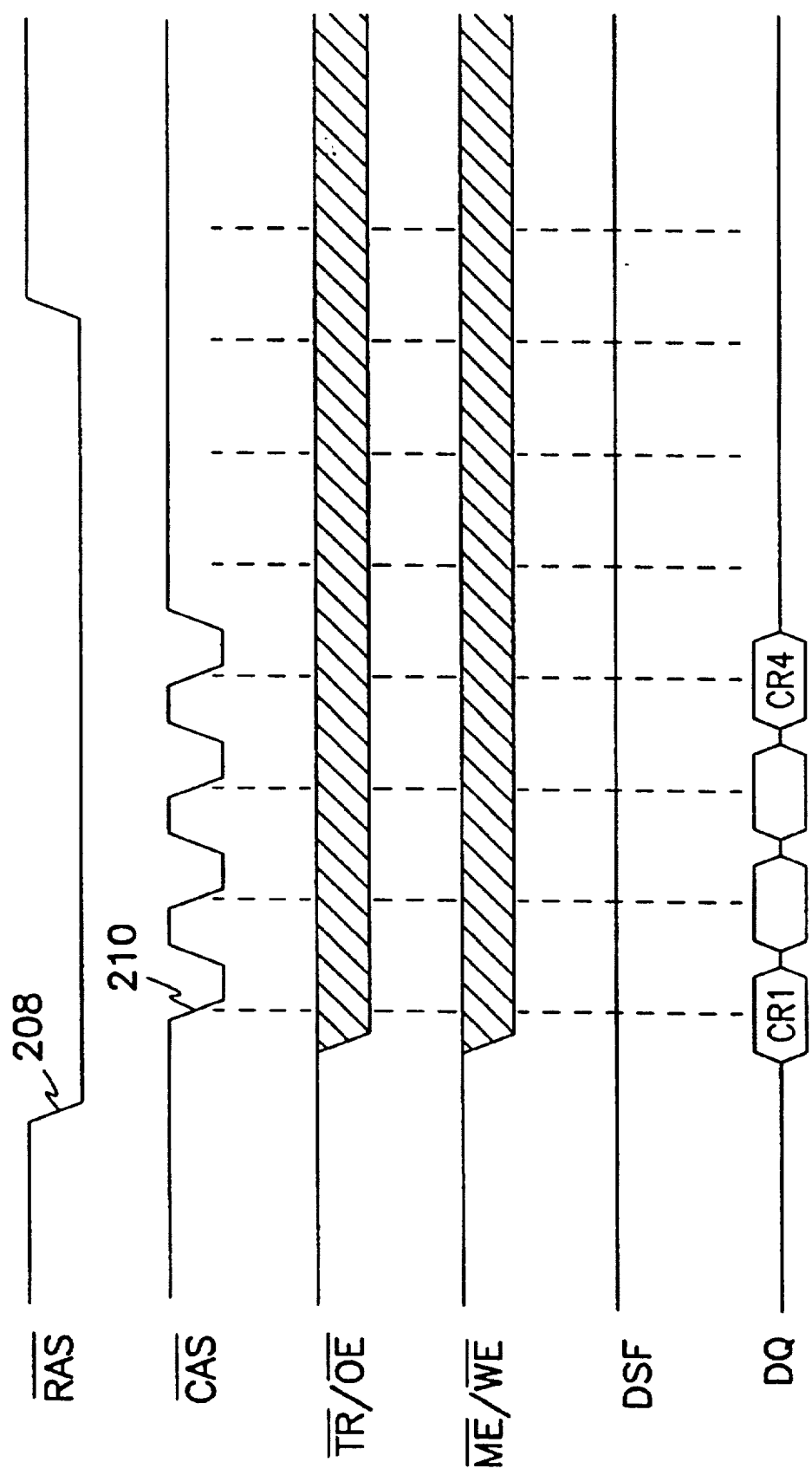
FIG. 6 is a timing diagram of another embodiment of a load color register function.

One method of loading a multi-bit color register of the present invention is to cycle the CAS* a successive number of times to load the register. On each cycle, data is written to one bit of each sub-register 190. FIG. 6 shows the timing diagram for this method of loading the color register. When the row access strobe (RAS*) goes low 208, CAS*, TR*/OE*, ME*/WE*, and DSF are all high to indicate that a load color register operation is to be performed. The CAS* input is then cycled four times 210. One of the four bits of the color sub-registers are loaded each time CAS* goes low. In one embodiment, the least significant bit of each sub-register CR1 is loaded first and the most significant CR4 is loaded last.

While performing a block write function, the two least significant bits of the column address (A0-1) are ignored. That is, column address bits A2-A8 are used to identify the block of columns to be written to and A0, A1 are ignored. Thus, A0 and A1 can be used during the load color register function to indicate which of the four bits (CR1-4) of each sub-registers 190 is being loaded, as shown in Table 1. Therefore, any of the bits can be loaded in any order and need not follow a least significant to most significant bit pattern. Further, only one bit can be loaded if that bit is the only bit that needs to be changed. Significant reductions in editing can, therefore, be achieved.

TABLE 1

|     | A0 | A1 |
| --- | --- | --- |
| CR1 | 0 | 0 |
| CR2 | 1 | 0 |
| CR3 | 0 | 1 |
| CR4 | 1 | 1 |

Figure 7:
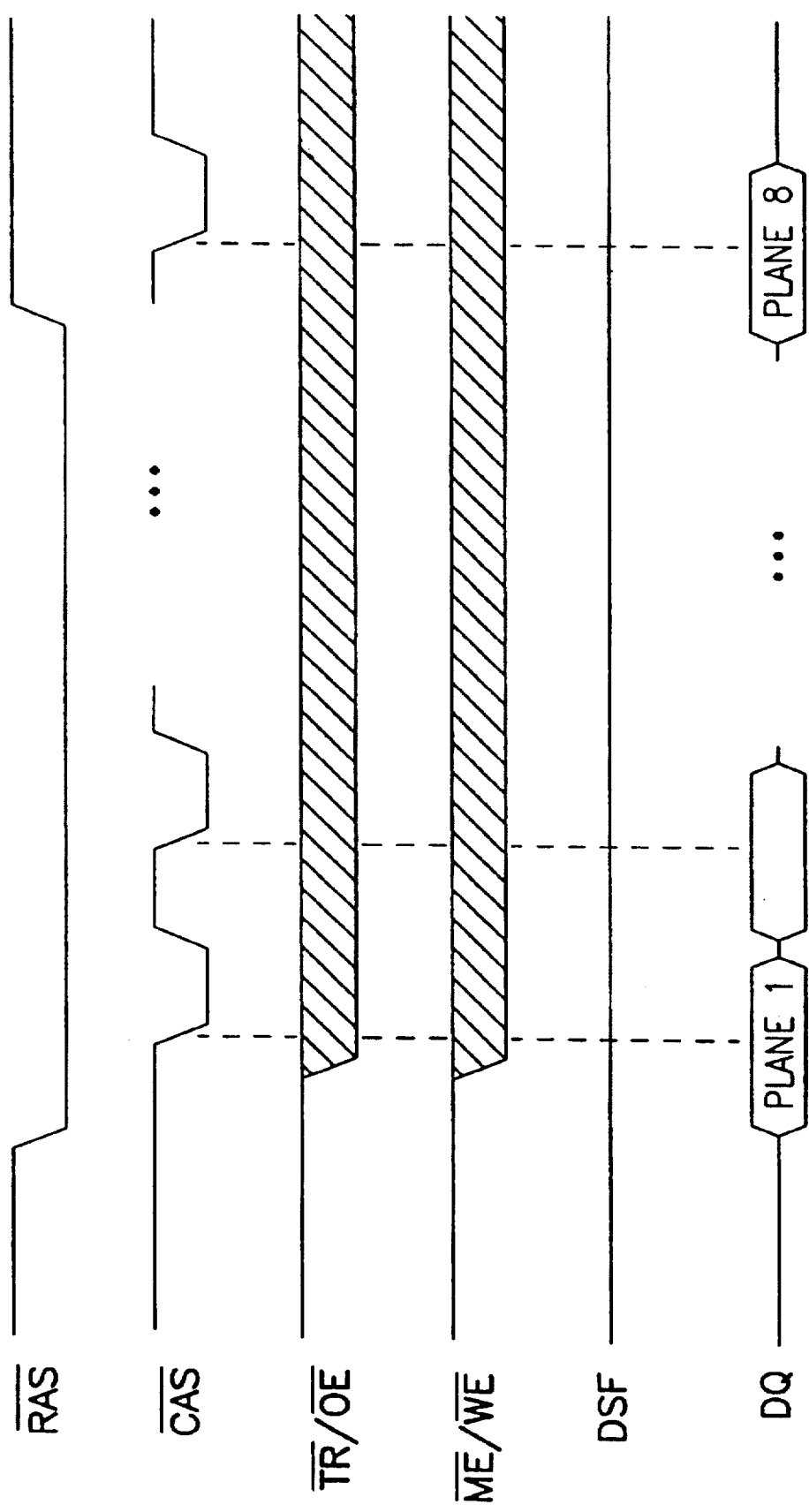
FIG. 7 is a timing diagram of another embodiment of a load color register function.

An alternate method which could be used to load the color register would be to load one plane, or one sub-register on the falling edge of CAS*. Therefore, the portion of the register associated with one plane of memory would be loaded at once. The CAS* line would be cycled according to the number of planes included in the memory, (eight in this embodiment) see FIG. 7. This method can be modified to allow for any number of planes of the color register to be loaded.

Figure 8:
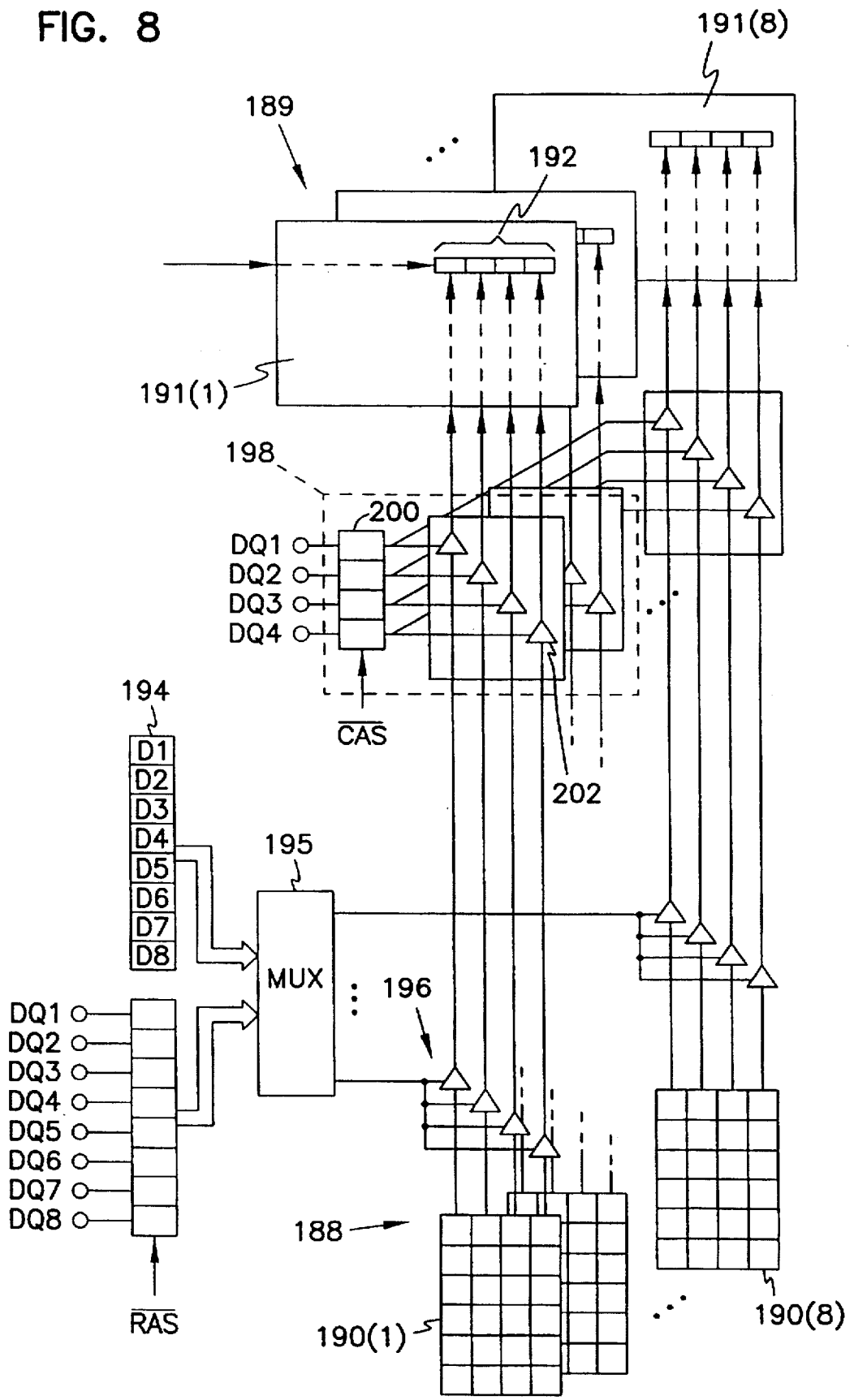
FIG. 8 is an alternate embodiment of a block write of the present invention.

An alternate embodiment of the present invention is illustrated in FIG. 8. The write register 188 further includes multiple registers. U.S. Pat. No. 5,282,177 entitled "Multiple Register Block Write Method and Circuit for Video DRAMs" describes a multiple register for block writing and is incorporated herein. The multiple write register allows a block write to be performed from one of a plurality of write registers rather than a single write register. The plurality of write registers can be pre-loaded with data. One of the plurality of write registers can then be selected and block written to the memory. This embodiment not only allows the pre-loading of data but allows the bits of memory to be written to multiple states. This multiple write register can be loaded with any of the methods described above.

SUMMARY

The present invention provides a multi-bit write register which allows each memory cell in a block of memory cells to be written to a state which can be different than the state of the other memory cells in the block. The write register can be a color register in a multi-port or single-port memory device. Several methods of loading a multi-bit color register are provided. One method includes loading the register one column at a time in either a pre-determined pattern or in a selective manner. Another method provides for loading the register one plane at a time.

What is claimed is:

1. A memory device comprising:

an array of dynamic random access memory cells arranged in planes of rows and columns;

a controller for controlling operations of the memory device;

an addressable block of memory cells located in one memory cell plane of the array, the addressable block of memory cells comprising a plurality of memory cells; and a write register having a plurality of registers, each register has a plurality of bits corresponding to the one plane, where each register bit writable to one of the plurality of memory cells of the addressable block of memory cells.

2. The memory device of claim 1 further comprising a mask circuit electrically located between the write register and the plurality of memory cells.

3. The memory device of claim 2 where the mask circuit comprises a column mask for preventing data transfer from the write register to a predefined column of the array.

4. The memory device of claim 3 where the column mask is controlled in response to a column mask register.

5. The memory device of claim 4 where the column mask register is loaded with data received on data input connections.

6. The memory device of claim 5 where the column mask register is loaded in response to a column address strobe signal.

7. The memory device of claim 2 where the mask circuit comprises a plane mask for preventing data transfer from the write register to a predefined plane of the array.

8. The memory device of claim 7 where the plane mask is controlled in response to either a plane mask register or data received on data input connections.

9. The memory device of claim 8 wherein the plane mask comprises a multiplex circuit for selecting between the plane mask register or the data input connections.

10. The memory device of claim 8 where the data received on the data input connections is latched in response to a column address strobe signal.

11. The memory device of claim 1 where the write register comprises a color register coupled to the plurality of memory cells for writing cells of the addressable block of memory cells to multiple states.

12. A processing system comprising:

a processor; and a memory device comprising:

an array of dynamic random access memory cells arranged in planes of rows and columns, a controller for controlling operations of the memory device;

an addressable block of memory cells located in one memory cell plane of the array, the addressable block of memory cells comprising a plurality of memory cells; and a color register having a plurality of register bits arranged in a plurality of multibit planes, each one of the plurality of multi-bit planes corresponding to a different one of the plurality of memory planes and each one of the plurality of register bits being connected to one of the plurality of memory cells.

13. The processing system of claim 12 further comprising at least one mask circuit electrically located between the color register and the plurality of memory cells.

14. A memory device comprising:

an array of dynamic random access memory cells arranged in planes of rows and columns;

a controller for controlling operations of the memory device;

an addressable block of memory cells located in one memory cell plane of the array, the addressable block of memory cells comprise four memory cells; and a write register having four register bits corresponding to the one plane of the integrated circuit memory with each one of the four register bits writable to one of the four memory cells of the addressable block of memory cells.

15. The memory device of claim 14 further comprising a mask circuit electrically located between the write register and the plurality of memory cells.

16. The memory device of claim 15 where the mask circuit comprises a column mask for preventing data transfer from the write register to a predefined column of the array.

17. The memory device of claim 16 where the column mask is controlled in response to a column mask register.

18. The memory device of claim 17 where the column mask register is loaded with data received on data input connections.

19. The memory device of claim 18 where the column mask register is loaded in response to a column address strobe signal.

20. The memory device of claim 15 where the mask circuit comprises a plane mask for preventing data transfer from the write register to a predefined plane of the array.

21. The memory device of claim 20 where the plane mask is controlled in response to either a plane mask register or data received on data input connections.

22. The memory device of claim 21 wherein the plane mask comprises a multiplex circuit for selecting between the plane mask register or the data input connections.

23. The memory device of claim 21 where the data received on the data input connections is latched in response to a column address strobe signal.

24. The memory device of claim 14 comprising:

eight memory cell planes; and eight write registers, each one of the eight write registers corresponding to one of the eight memory cell planes.

* * * * *

UNITED STATES PATENT AND TRADEMARK OFFICE
CERTIFICATE OF CORRECTION

PATENT NO. : 5,896,339
DATED : Apr. 20, 1999
INVENTOR(S) : Lauren L. McLaury

It is certified that error appears in the above-identified patent and that said Letters Patent is hereby corrected as shown below:

On the title page, item [22], please delete "Filed: Aug. 3, 1998" and insert --Filed: Sep 3, 1998-- therefor.

Signed and Sealed this

Seventh Day of December, 1999

*Attest:*

Q. TODD DICKINSON

*Attesting Officer*     Acting Commissioner of Patents and Trademarks